(12) United States Patent
Ishiguro et al.

(10) Patent No.: US 7,868,695 B2
(45) Date of Patent: Jan. 11, 2011

(54) DIFFERENTIAL AMPLIFIER

(75) Inventors: Kazuhisa Ishiguro, Ota (JP); Yoshiaki Takahashi, Ora-machi (JP)

(73) Assignee: Ricoh Co., Ltd., Tokyo (JP)

( * ) Notice: Subject to any disclaimer, the term of this patent is extended or adjusted under 35 U.S.C. 154(b) by 377 days.

(21) Appl. No.: 12/091,417

(22) PCT Filed: Aug. 2, 2006

(86) PCT No.: PCT/JP2006/315696

§ 371 (c)(1),
(2), (4) Date: Apr. 24, 2008

(87) PCT Pub. No.: WO2007/049390

PCT Pub. Date: May 3, 2007

(65) Prior Publication Data

US 2010/0001797 A1 Jan. 7, 2010

(30) Foreign Application Priority Data

Oct. 24, 2005 (JP) ............................. 2005-308015

(51) Int. Cl.
*H03F 3/45* (2006.01)
(52) U.S. Cl. .................. 330/253; 330/257; 330/255
(58) Field of Classification Search ................. 330/253, 330/257, 255
See application file for complete search history.

(56) References Cited

U.S. PATENT DOCUMENTS

| | | | | |
|---|---|---|---|---|
| 4,333,058 A | * | 6/1982 | Hoover | 330/253 |
| 5,642,062 A | * | 6/1997 | Kawakami | 327/66 |
| 5,714,906 A | * | 2/1998 | Motamed et al. | 327/563 |
| 6,137,360 A | * | 10/2000 | Memida | 330/253 |
| 6,731,170 B2 | * | 5/2004 | Juang | 330/261 |
| 6,975,168 B2 | * | 12/2005 | Tobita | 330/253 |
| 7,170,351 B2 | * | 1/2007 | Shimatani | 330/255 |

FOREIGN PATENT DOCUMENTS

| | | |
|---|---|---|
| JP | 61-078212 A | 4/1986 |
| JP | 2002-290172 A | 10/2002 |

* cited by examiner

*Primary Examiner*—Patricia Nguyen
(74) *Attorney, Agent, or Firm*—Connolly Bove Lodge & Hutz LLP

(57) ABSTRACT

A differential amplifier circuit at the input stage is configured with a twin differential type having a first differential amplifier circuit (11) and a second differential amplifier circuit (12), respective outputs of which are received by a first and a second source-grounded amplifier (M5, M10). The second source-grounded amplifier (M10) is connected to a current mirror circuit (M11, M12), which is driven by the drain current of the second source-grounded amplifier (M10). With this configuration, the dynamic range for the upper half portion of an alternating signal output from an output terminal (OUT) is determined by the current supply capability of the first source-grounded amplifier (M5) and the dynamic range for the lower half portion is determined by the current supply capability of the second source-grounded amplifier (M10). This eliminates the need of a constant current circuit of a large current for generating a signal having lower half portion in which the waveform distortion is improved.

2 Claims, 5 Drawing Sheets

$$I_d = \frac{1}{2} K' \frac{W}{L} (V_{gs} - V_{th})^2 (1 + \lambda V_{ds}) \quad \text{------------------------} \quad （式1）$$

$$K' = \mu_o C_{ox}$$

DIFFERENTIAL AMPLIFIER

This application is a national phase of PCT/JP2006/315696, filed Aug. 2, 2006, which claims priority to JP 205-308015, filed Oct. 24, 2005, the disclosure of which is incorporated by reference.

TECHNICAL FIELD

The present invention relates to a differential amplifier. More particularly, the present invention is suitable for a differential amplifier in which an output of a differential amplifier circuit at an input stage is received by a source-grounded amplifier at a subsequent stage.

BACKGROUND ART

Power amplifiers include class A, class AB, class B, class C, and class D amplifiers depending on differences of operating points. Class A and class AB amplifiers are often used for audios and "class AB push-pull types" are often employed in which the upper half portion (positive half-period) and the lower half portion (negative half-period) of an alternating signal are operated by respective transistors to realize low current consumption. In the class AB push-pull type, an output signal is generated by driving the upper half portion and the lower half portion by an output transistor with a push-pull connection.

FIG. 1 is a diagram showing an exemplary configuration of an operational amplifier using a conventional class A operation. In FIG. 1, reference numeral 11 denotes a differential amplifier circuit comprising: a differential pair made of two transistors M1 and M2; a current mirror circuit made of two transistors M3 and M4 for receiving an output of the differential amplifier circuit 11 with double ends; and a constant current circuit Ic connected to the differential pair. The pair of transistors M1 and M2 of the differential pair has their gates connected to two input terminals IN1 and IN2.

Additionally, sources of the two transistors M1 and M2 are connected each other and one end of the constant current circuit Ic is connected to their common source. The other end of the constant current circuit Ic is grounded. Drains of the two transistors M1 and M2 are connected to a power supply VDD through the respective transistors M3 and M4. The transistors M3 and M4 are connected each other by a current mirror.

Reference characters R1 and R2 denote bias resistances applying a bias voltage VB to the transistors M1 and M2. Additionally, reference character M5 denotes a source-grounded transistor whose gate is supplied with an output signal of the differential amplifier circuit 11, and which functions as a source-grounded amplifier. The source-grounded amplifier M5 has its drain connected to a constant current circuit Io and an output terminal OUT, while a source of the source-grounded amplifier M5 is connected to the power supply VDD. In this manner, the conventional class A amplifier receives the output of the differential amplifier circuit 11 by the source-grounded amplifier M5.

FIG. 2 shows diagrams illustrating waveforms of an alternating signal output from the output terminal OUT. In the class A amplifier configured as described above, a dynamic range for the upper half portion (positive half-period) U of the alternating signal output from the output terminal OUT is determined by the current supply capability of the source-grounded amplifier M5. Since the source-grounded amplifier M5 can be driven sufficiently by the power supply VDD, it has a large current supply capability. Thus, as for the positive half-period U of the alternating signal, it is possible to ensure a sufficiently large amplitude, as shown in FIG. 2(a).

Meanwhile, a dynamic range of the lower half portion (negative half-period) D of the alternating signal is determined by a current value of the constant current circuit Io. Accordingly, if the current value of the constant current circuit Io is sufficiently large, a large amplitude can be obtained even in the negative half-period D, as shown in FIG. 2(a). On the other hand, if the current value of the constant current circuit Io is small, a large amplitude cannot be obtained in the negative half-period D so that the waveform of the alternating signal is distorted, as shown in FIG. 2(b).

Thus, there is a problem that in order to suppress the distortion of the alternating signal the current value of the constant current circuit Io has to be increased so that current consumption increases. In particular, in accordance with a heavier load (smaller load resistance) connected to the output terminal OUT, distortion occurs in the signal unless the value of the constant current circuit Io is increased. Accordingly, if the load connected to the output terminal OUT becomes heavy in the circuit of FIG. 1, it is quite difficult to achieve low current consumption.

A technique is proposed in which two in-phase and anti-phase output signals are received by having an output of a differential amplifier circuit pass through a current mirror circuit (for example, see Patent document 1).

[Patent document 1]: Japanese Patent Laid-open No. 11-308057

DISCLOSURE OF THE INVENTION

In the technique according to Patent document 1, there is a problem that an output offset current increases under the influence of a channel modulation effect due to a greater use of a current mirror circuit. Also, since a phase difference arises between the two in-phase and anti-phase output signals in a high frequency domain, distortion generation cannot be avoided. Because of this, there is a problem that the amplifier according to Patent document 1 cannot be used in the high frequency domain.

The present invention has been made to solve the problems and has an object to provide a differential amplifier capable of being used even in the high frequency domain, improving an output offset current and distortion of a signal due to the channel modulation effect, and reducing current consumption.

In order to solve the problems, a differential amplifier of the present invention has a configuration in which a differential amplifier circuit at the input stage is of a twin differential type having a first differential amplifier circuit and a second differential amplifier circuit, and respective differential outputs of the circuits are received by a first and a second source-grounded amplifiers. The first and the second source-grounded amplifiers receive the outputs with double ends through a current mirror circuit.

In another aspect of the present invention, transistors of the first and the second differential amplifier circuits have the same polarities and sizes, and transistors of the first and the second source-grounded amplifiers have the same polarities and sizes.

According to the configuration of the present invention, a dynamic range for the upper half portion (positive half-period) of an alternating signal output from an output terminal is determined by the current supply capability of the first source-grounded amplifier and a dynamic range for the lower half portion (negative half-period) is determined by the current supply capability of one transistor of the current mirror circuit. The current supply capability of the one transistor is determined by the current supply capability of the second source-grounded amplifier connected to the current mirror circuit. That is, the lower half portion of the alternating signal is determined by the current supply capability of the second source-grounded amplifier.

Here, both the first source-grounded amplifier and the second source-grounded amplifier can realize a sufficiently large current supply capability. Thus, according to the present invention, a sufficiently large amplitude can be obtained at the lower half portion of the alternating signal and the waveform distortion can be suppressed without increasing a current value of the constant current circuit. According to the present invention, the output offset current generation can also be suppressed because a small number of the current mirror circuits are used. Additionally, according to another feature of the present invention, since the polarities and sizes of devices etc. at an input signal path are the same up to drains of the first source-grounded amplifier and the second source-grounded amplifier, a phase difference is less likely to occur between the upper half portion and the lower half portion of the alternating signal even in the high frequency domain. As a result, generation of the alternating signal distortion can be suppressed.

BRIEF DESCRIPTION OF THE DRAWINGS

FIG. 7 is a diagram showing a drain current of a transistor in the case of considering a channel modulation effect.

BEST MODE FOR CARRYING OUT THE INVENTION

First Embodiment

Figure 3:
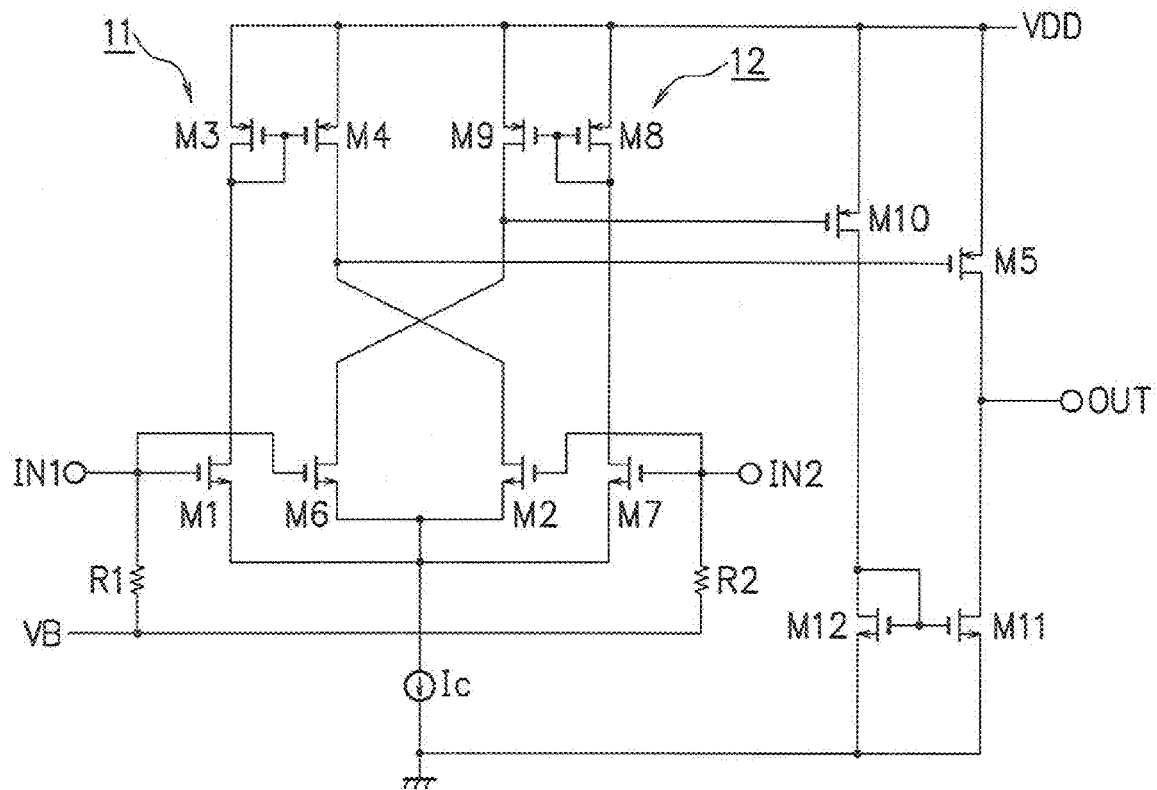
FIG. 3 is a diagram showing an exemplary configuration of a differential amplifier according to a first embodiment.

Hereinafter, a first embodiment of the present invention is described with reference to the drawings. FIG. 3 is a diagram showing an exemplary configuration of a differential amplifier of the first embodiment. In FIG. 3, components having the same functions as the components shown in FIG. 1 have the same reference characters.

As shown in FIG. 3, the embodiment has a configuration in which a differential amplifier at the input stage is of a twin differential type, that is, comprises a first differential amplifier circuit 11 and a second differential amplifier circuit 12. Both of these two differential amplifier circuits 11 and 12 perform an amplification operation based on signals input from the same input terminals IN1 and IN2, and output amplified signals.

Figure 1:
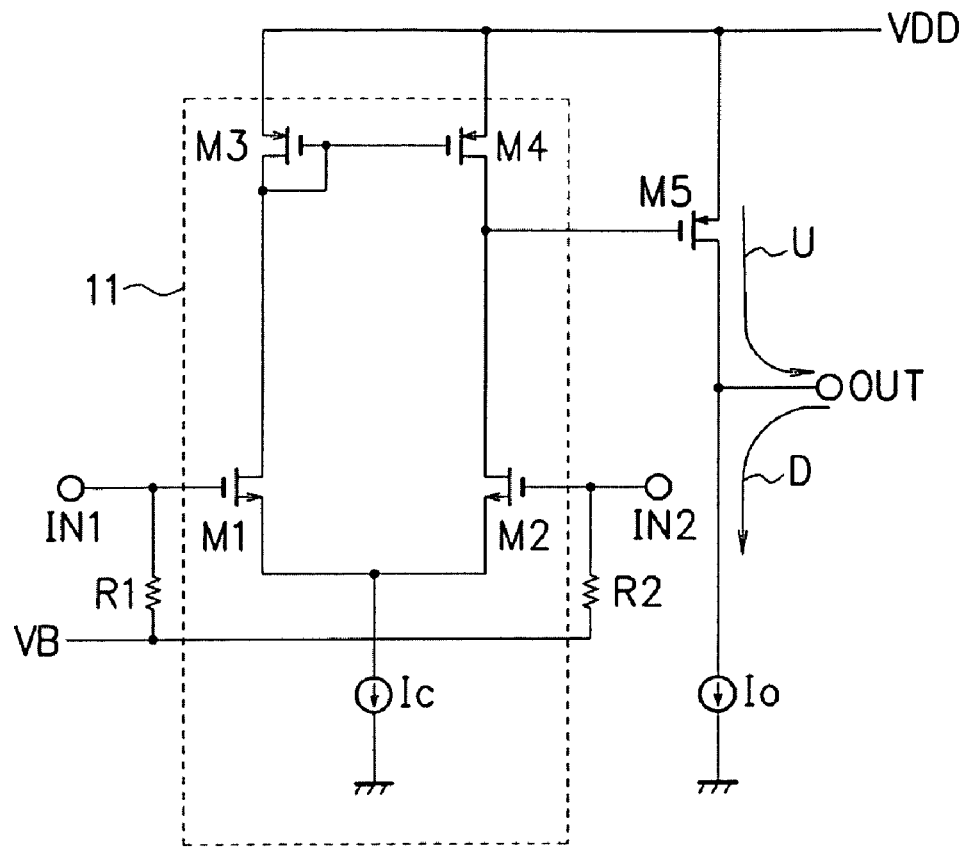
FIG. 1 is a diagram showing an exemplary configuration of a conventional differential amplifier.
Figure 2:
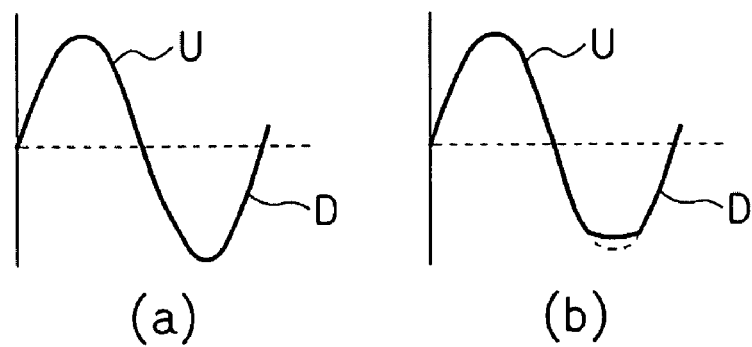
FIG. 2 shows diagrams illustrating waveforms of an alternating signal output from an output terminal of the differential amplifier.

The first differential amplifier circuit 11 similar to the circuit of FIG. 1 comprises: a differential pair made of two transistors M1 and M2; a current mirror circuit made of two transistors M3 and M4 for receiving an output of the differential amplifier circuit 11 with double ends; and a constant current circuit Ic connected to the differential pair. The pair of transistors M1 and M2 of the differential pair has their gates connected to the two input terminals IN1 and IN2.

Additionally, in the differential pair of the first differential amplifier circuit 11, sources of the two transistors M1 and M2 are connected each other and one end of the constant current circuit Ic is connected to their common source. The other end of the constant current circuit Ic is grounded. Drains of the two transistors M1 and M2 are connected to a power supply VDD through the respective transistors M3 and M4. The transistors M3 and M4 are connected each other by a current mirror.

Also, the second differential amplifier circuit 12 comprises: a differential pair made of two transistors M6 and M7; a current mirror circuit made of two transistors M8 and M9 for receiving the output of the differential amplifier circuit 11 with double ends; and the constant current circuit Ic connected to the differential pair. The constant current circuit Ic is shared between the two differential amplifier circuits 11 and 12. The same two input terminals IN1 and IN2 as the first differential amplifier circuit 11 are connected to gates of the pair of transistors M6 and M7 configuring the differential pair of the second differential amplifier circuit 12.

In the differential pair of the second differential amplifier circuit 12, sources of the two transistors M6 and M7 are connected each other and one end of the constant current circuit Ic is connected to their common source. The other end of the constant current circuit Ic is grounded. Drains of the two transistors M6 and M7 are connected to the power supply VDD through the respective transistors M8 and M9. The transistors M8 and M9 are connected each other by a current mirror.

The output of the first differential amplifier circuit 11 is connected to a gate of a first source-grounded amplifier M5. A drain of the first source-grounded amplifier M5 is connected to a drain of one transistor M11 of a current mirror circuit and an output terminal OUT. Also, a source of the first source-grounded amplifier M5 is connected to the power supply VDD. Thus, in the embodiment, the output of the first differential amplifier circuit 11 is received by the first source-grounded amplifier M5.

Similarly, an output of the second differential amplifier circuit 12 is connected to a gate of a second source-grounded amplifier M10. A drain of the second source-grounded amplifier M10 is connected to the other transistor M12 of the current mirror circuit. Also, a source of the second source-grounded amplifier M10 is connected to the power supply VDD. Thus, in the embodiment, the output of the second differential amplifier circuit 12 is received by the second source-grounded amplifier M10.

The transistor M11 (the one transistor according to the present invention) connected to the first source-grounded amplifier M5 and the transistor M12 connected to the second source-grounded amplifier M10 are current-mirror connected. The transistor M12 is driven by a drain current of the second source-grounded amplifier M10. If the sizes of the two current-mirror connected transistors M11 and M12 are the same, the transistor M11 also has the same driving capability as the transistor M12.

In the above configuration, all the polarities and sizes of the transistors M1, M2, M6 and M7 are the same. All the polarities and sizes of the transistors M3, M4, M8 and M9 are also the same. Further, the polarities and sizes of the transistors M5 and M10 are the same. Here, the transistors M3, M4 and the transistor M5 do not necessarily have the same polarities and sizes, and also, the transistors M8, M9 and the transistor M10 do not necessarily have the same polarities and sizes. And again, the polarities and sizes of the transistors M11 and M12 are the same.

Now, the drain current flowing through the second source-grounded amplifier M10 is described. In the case of no input signals to the input terminals IN1 and IN2, the drain current flowing through the second source-grounded amplifier M10 (this is called an idling current) is Icom/4+ΔI because of the following reasons. Note that Icom is a common current value of the constant current circuit Ic and ΔI is a current increment by the channel modulation effect.

In the case of considering the channel modulation effect, the drain currents Id of the transistors M8 and M9 are derived from Formula 1 shown in FIG. 7 because operating points of the transistors M8 and M9 are in a saturation region. In Formula 1, W is a gate width of the transistors M8 and M9, L is a gate length of the transistors M8 and M9, $\mu_0$ is carrier mobility, Cox is gate oxide film capacitance per unit area, and λ is a parameter indicating a relative value of channel length variation when a drain-source voltage Vds increases.

Figure 4:
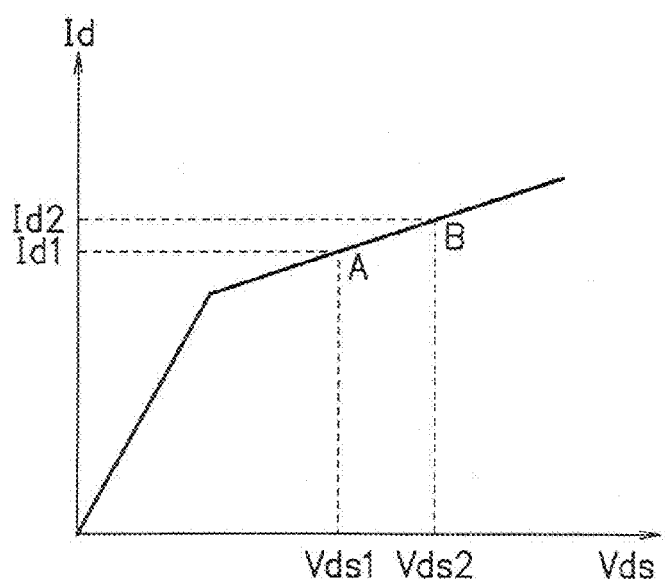
FIG. 4 is a diagram showing the relation between a drain current and a drain-source voltage.

FIG. 4 is obtained by schematizing Formula 1. In FIG. 4, it is assumed that operating balance of the transistors M8 and M9 is off in an initial state, an operating point of the transistor M8 is at point A (a drain current is Id1, a drain-source voltage is Vds1) and an operating point of the transistor M9 is at point B (a drain current is Id2, a drain-source voltage is Vds2). However, the operating point of the transistor M9 has to vary from the point B to the point A according to negative feedback operations of the transistors M8 and M9 because drain currents of the transistors M6 and M7 are identical. Thus, a stable point of the transistor M9 is the point A with the drain-source voltage being Vds1.

Generally, in an ideal transistor saturation region without the channel modulation effect, the drain current Id does not vary in response to the variation of the drain-source voltage Vds, and therefore, a stable point such as the point A does not exist. On the other hand, in the embodiment, the stable point of the transistor M9 is created by using the channel modulation effect originally having a bad influence on circuit design. Since the transistor M8 is a diode having its gate and drain connected, a gate-source voltage of the transistor M9 is equal to a gate-source voltage Vgs1 of the transistor M8.

Here, the drain-source voltage of the transistor M9 is equal to the gate-source voltage Vgs1 of the transistor M8 because the gate-source voltages Vgs and the drain current Id of the transistors M8 and M9 are equal to each other. As a result, a gate-source voltage of the second source-grounded amplifier M10 is also Vgs1, however, a drain-source voltage of the second source-grounded amplifier M10 is greater than the drain-source voltages Vgs1 of the transistors M8 and M9. Thus, the idling current of the second source-grounded amplifier M10 is Icom/4+ΔI to which the increment ΔI by the channel modulation effect is added.

The drain current of the second source-grounded amplifier M10 can also be increased during signal input by increasing the idling current of the second source-grounded amplifier M10 under no-signal conditions. As concerns this, the first source-grounded amplifier M5 is the same. An idling current of the first source-grounded amplifier M5 is also Icom/4+ΔI because of the same reasons described above. The increase of the idling current can also increase the drain current of the first source-grounded amplifier M5 during signal input.

For example, in the case that a heavy load (not shown) is connected to the output terminal OUT, and it is desired to increase the drain currents of the source-grounded amplifiers M5, M10 without increasing the common current value Icom of the constant current circuit Ic used in the differential amplifier circuits 11, 12; it can be realized by shorter gate length L of the source-grounded amplifiers M5, M10 or wider gate width W thereof. Considering manufacture processes of semiconductors, it is easier to enlarge the gate width W.

In the differential amplifier of the embodiment configured as described above, the dynamic range for the upper half portion (positive half-period) of an alternating signal output from the output terminal OUT is determined by the drain current supply capability of the first source-grounded amplifier M5. The first source-grounded amplifier M5 can realize the sufficiently large current supply capability by the power supply VDD. Meanwhile, the dynamic range for the lower half portion (negative half-period) of the alternating signal is determined by the drain current supply capability of the transistor M11.

As described above, the transistor M12 is current-mirror connected to the transistor M11 and the transistor M12 is driven by the drain current of the second source-grounded amplifier M10. Since the sizes of the two current-mirror connected transistors M11 and M12 are the same, the transistors M11 and M12 have the same driving capability. Accordingly, it can be mentioned that the dynamic range for the lower half portion D of the alternating signal is determined by the drain current supply capability of the second source-grounded amplifier M10. The second source-grounded amplifier M10 can also realize the sufficiently large current supply capability by the power supply VDD.

As described above, according to the embodiment, the second source-grounded amplifier M10 and the current mirror circuit M11, M12 connected thereto are used to generate the lower half portion of the alternating signal instead of using a constant current circuit as the conventional technique. Because of this, as to the lower half portion of the alternating signal, a sufficiently large dynamic range can be obtained without increasing a current value of the constant current circuit, thereby being able to suppress the waveform distortion at the lower half portion of the alternating signal.

In the embodiment, an output offset current generation can also be suppressed because a small number of the current mirror circuits are used. According to the embodiment, since the polarities and sizes of devices etc. at an input signal path are the same up to the drains of the first source-grounded amplifier M5 and the second source-grounded amplifier M10, there are not many factors causing a phase difference between the upper half portion and the lower half portion of the alternating signal even in the high frequency domain. As a result, the distortion generation of the alternating signal can be suppressed. Additionally, the transistor M12 has a small impedance because of a diode connection, and a gain is 0 dB since a current mirror ratio is 1:1. Therefore, frequency characteristics are suitable even in the high frequency domain. Thus, it is possible to use the differential amplifier of the embodiment even in the high frequency domain, improve an output offset current and the distortion of a signal, and achieve low current consumption.

Second Embodiment

Figure 5:
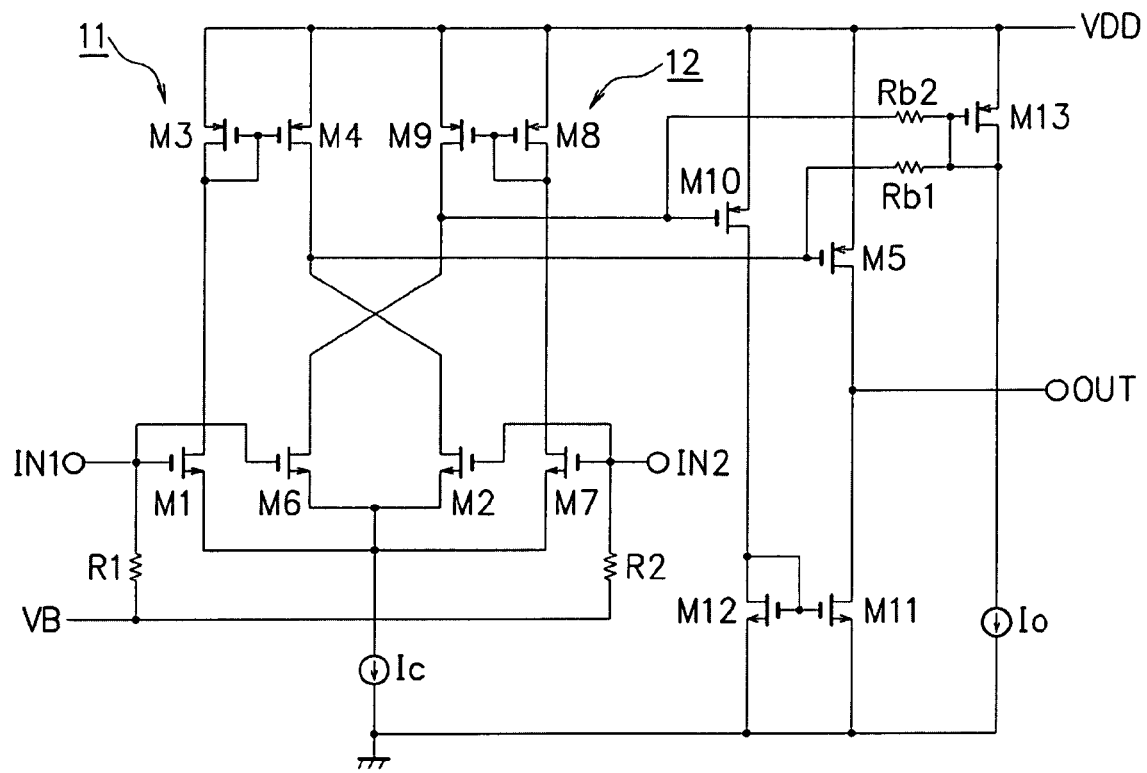
FIG. 5 is a diagram showing an exemplary configuration of a differential amplifier according to a second embodiment.

Now, a second embodiment of the present invention is described with reference to the drawings. FIG. 5 is a diagram showing an exemplary configuration of a differential amplifier according to the second embodiment. In FIG. 5, since some of the components with reference characters similar to the reference characters shown in FIG. 3 have similar functions, redundant description is omitted here.

In the first embodiment shown in FIG. 3, there is a case where input resistances of the source-grounded amplifiers M5 and M10 increase so that an open gain of an operational amplifier increases. In some cases depending on the kind and usage of an application circuit for applying the operational amplifier, the open gain of the operational amplifier is required to decrease. In the case, a circuit configuration such as FIG. 5 may as well be employed.

Specifically, a first bias resistance Rb1 is connected to a gate of a first source-grounded amplifier M5 and a second bias resistance Rb2 is connected to a gate of a second source-grounded amplifier M10. A transistor M13 and a constant current circuit Io are serially connected between a power supply VDD and the ground. The transistor M13, which functions as a bias circuit, has its gate and drain connected. The second bias resistance Rb2 is connected to the gate of the transistor M13, while the first bias resistance Rb1 is connected to the drain thereof.

Thus, in the second embodiment, gate biases of the source-grounded amplifiers M5 and M10 are supplied from the transistor M13 (bias circuit) whose gate and drain are connected through the bias resistances Rb1 and Rb2. With this configuration, input resistances of the source-grounded amplifiers M5 and M10 (load resistances of differential amplifier circuits 11 and 12) are determined by the bias resistances Rb1 and Rb2. Also, drain currents of the source-grounded amplifiers M5 and M10 are determined by a drain current of the transistor M13. As a result, if the sizes of the transistors M5, M10 and M13 are identical, the drain currents flowing through these are all the same.

Since the transistor M13 is driven by the power supply VDD to be able to obtain a sufficiently large drain current, the source-grounded amplifiers M5 and M10 can also obtain a sufficiently large drain current. Because of this, similarly to the first embodiment described above, a large dynamic range can be ensured at both the upper half portion and the lower half portion of an alternating signal output from an output terminal OUT, so that signal distortion can be suppressed. Additionally, appropriate values of the bias resistances Rb 1, Rb 2 can reduce the input resistances of the source-grounded amplifier M5, M10 and the open gain of the operational amplifier.

Third Embodiment

Figure 6:
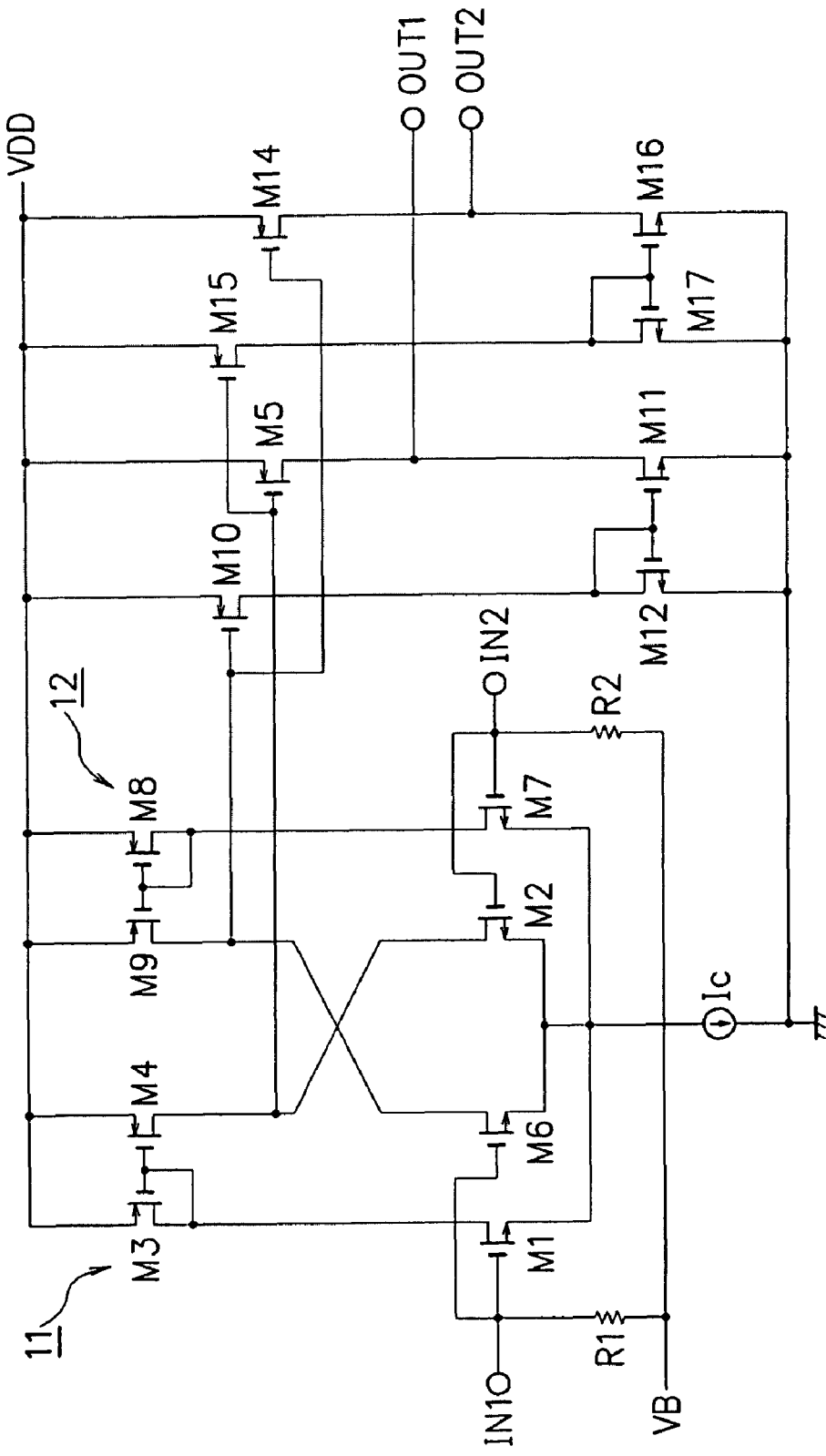
FIG. 6 is a diagram showing an exemplary configuration of a differential amplifier according to a third embodiment.

Now, a third embodiment of the present invention is described with reference to the drawings. FIG. 6 is a diagram showing an exemplary configuration of a differential amplifier according to the third embodiment. In FIG. 6, since some of the components with reference characters similar to the reference characters shown in FIG. 3 have similar functions, redundant description is omitted here.

In the third embodiment, it is possible to receive two in-phase and anti-phase output signals from a first and a second output terminals OUT1 and OUT2 by receiving an output of the differential amplifier by two pairs of current mirror circuits. Specifically, in addition to the components shown in FIG. 3, the third embodiment further comprises a third and a fourth source-grounded amplifiers M14 and M15, and a current mirror circuit made of two transistors M16 and M17.

An output of a first differential amplifier circuit 11 is also connected to a gate of the fourth source-grounded amplifier M15 besides a gate of a first source-grounded amplifier M5. A drain of the fourth source-grounded amplifier M15 is connected to a drain of the other transistor M17 of the current mirror circuit, while a source of the fourth source-grounded amplifier M15 is connected to a power supply VDD.

An output of a second differential amplifier circuit 12 is connected to a gate of the third source-grounded amplifier M14 besides a gate of a second source-grounded amplifier M10. A drain of the third source-grounded amplifier M14 is connected to a drain of one transistor M16 of the current mirror circuit and the second output terminal OUT2, while a source of the third source-grounded amplifier M14 is connected to the power supply VDD.

In the above configuration, all the polarities and sizes of transistors M3, M4, M8 and M9 are the same. The polarities and sizes of the transistors M5 and M10 are also the same. Further, the polarities and sizes of the transistors M14 and M15 are the same. Here, the transistors M3, M4 and the transistors M5, M15 do not necessarily have the same sizes, and also, the transistors M8, M9 and the transistors M10, M14 do not necessarily have the same sizes. And again, the polarities and sizes of transistors M11 and M12 are the same. The polarities and sizes of the transistors M16 and M17 are the same.

Thus, in the case of obtaining two in-phase and anti-phase output signals, since the polarities and sizes of devices etc. at an input signal path are the same up to the drains of the third source-grounded amplifier M14 and the fourth source-grounded amplifier M15, there are not many factors causing a phase difference between the upper half portion and the lower half portion of the alternating signal even in the high frequency domain. Additionally, the transistor M17 has a small impedance because of a diode connection, and a gain is 0 dB since a current mirror ratio is 1:1. Therefore, distortion due to a phase difference does not occur and frequency characteristics are suitable even in the high frequency domain.

In the first to third embodiments, an example is described in which the differential amplifier circuits 11, 12 and the source-grounded amplifiers M5, M10, M14, M15 are connected directly, while they may be connected through a capacitance.

While the first to third embodiments only show a concrete example for carrying out the present invention, the technical scope of the present invention should not be limited thereto. Thus, various modifications and changes may be made thereto without departing from the spirit and the main features of the present invention.

INDUSTRIAL APPLICABILITY

The present invention is useful for a differential amplifier for receiving an output of a differential amplifier circuit at an input stage by a source-grounded amplifier at a subsequent stage.

The invention claimed is:

1. A differential amplifier comprising:
a first differential amplifier circuit performing a differential amplification operation based on a difference between signals input from two input terminals;
a second differential amplifier circuit performing a differential amplification operation based on a difference between signals input from the same two input terminals as the first differential amplifier circuit;
a first source-grounded amplifier connected to an output of the first differential amplifier circuit;
a second source-grounded amplifier connected to an output of the second differential amplifier circuit;
a current mirror circuit connected to the second source-grounded amplifier and driven by a drain current of the second source-grounded amplifier;
bias resistances connected to gates of the first source-grounded amplifier and the second source-grounded amplifier, respectively; and
a bias circuit connected to the bias resistances;
wherein gate biases of the first source-grounded amplifier and the second source-grounded amplifier are supplied from the bias circuit through the bias resistances; and wherein an output terminal is connected between one transistor of the current mirror circuit and the first source-grounded amplifier.

2. The differential amplifier according to claim 1, wherein the polarities and sizes of transistors of the first differential amplifier circuit and the second differential amplifier circuit are the same, and the polarities and sizes of transistors of the first source-grounded amplifier and the second source-grounded amplifier are the same.

* * * * *